United States Patent
Cannon et al.

(10) Patent No.: US 7,521,776 B2
(45) Date of Patent: Apr. 21, 2009

(54) SOFT ERROR REDUCTION OF CMOS CIRCUITS ON SUBSTRATES WITH HYBRID CRYSTAL ORIENTATION USING BURIED RECOMBINATION CENTERS

(75) Inventors: Ethan H. Cannon, Essex Junction, VT (US); Toshiharu Furukawa, Essex Junction, VT (US); Charles Koburger, III, Delmar, NY (US); Jack A. Mandelman, Flat Rock, NC (US); William Tonti, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 85 days.

(21) Appl. No.: 11/618,346

(22) Filed: Dec. 29, 2006

(65) Prior Publication Data

US 2008/0157202 A1    Jul. 3, 2008

(51) Int. Cl.
    *H01L 29/04*    (2006.01)
(52) U.S. Cl. .................. 257/627; 257/347; 257/349; 257/E27.112
(58) Field of Classification Search .............. 257/627, 257/376, 347, 349, E27.112, 131, 156
See application file for complete search history.

(56) References Cited

U.S. PATENT DOCUMENTS

| | | | |
|---|---|---|---|
| 4,506,436 A | | 3/1985 | Bakeman, Jr. et al. |
| 4,881,107 A | * | 11/1989 | Matsushita .................. 257/338 |
| 4,920,396 A | | 4/1990 | Shinohara et al. |
| 5,384,477 A | * | 1/1995 | Bulucea et al. ............. 257/372 |
| 5,702,973 A | | 12/1997 | Mitani et al. |
| 5,883,408 A | | 3/1999 | Tsukamoto |
| 6,153,920 A | | 11/2000 | Gossmann et al. |
| 6,395,587 B1 | | 5/2002 | Crowder et al. |
| 6,754,093 B2 | | 6/2004 | Lien |
| 6,972,478 B1 | * | 12/2005 | Waite et al. .................. 257/627 |
| 7,208,811 B2 | * | 4/2007 | Tamai ......................... 257/461 |
| 7,304,354 B2 | * | 12/2007 | Morris ........................ 257/372 |
| 2004/0000691 A1 | | 1/2004 | Wieczorek et al. |

OTHER PUBLICATIONS

Bogen, S., et al., "Reduction of Lateral Parasitic Current Flow by Buried Recombination Layers Formed by High Energy Implantation of C or O into Silicon", IEEE, 1997 pp. 792-795.
Brack, et al., "Prevention of Alpha-Particle Induced Fails in Dynamic Memories", Vol. 22, No. 9, Feb. 1980, pp. 4106.
Masters, et al., "Proton Implantation Process for Reducing Alpha Induced 'Soft Errors'", vol. 22, No. 12, May 1980, p. 5326.
Anolick, et al., "Reduction of Alpha Radiation Impact on CCD Memories", vol. 22, No. 6, Nov. 1979, p. 2355.

* cited by examiner

*Primary Examiner*—Lynne A. Gurley
*Assistant Examiner*—Jesse Y Miyoshi
(74) *Attorney, Agent, or Firm*—Scully, Scott, Murphy & Presser, P.C.; Richard M. Kotulak, Esq.

(57) ABSTRACT

Novel semiconductor structures and methods are disclosed for forming a buried recombination layer underneath the bulk portion of a hybrid orientation technology by implanting at least one recombination center generating element to reduce single event upset rates in CMOS devices thereabove. The crystalline defects in the buried recombination layer caused by the recombination center generating elements are not healed even after a high temperature anneal and serve as recombination centers where holes and electrons generated by ionizing radiation are collected by. Multiple buried recombination layers may be formed. Optionally, one such layer may be biased with a positive voltage to prevent latchup by collecting electrons.

1 Claim, 2 Drawing Sheets

SOFT ERROR REDUCTION OF CMOS CIRCUITS ON SUBSTRATES WITH HYBRID CRYSTAL ORIENTATION USING BURIED RECOMBINATION CENTERS

FIELD OF THE INVENTION

The present invention relates to semiconductor devices, and particularly, to radiation hardened complementary metal oxide semiconductor (CMOS) transistors.

BACKGROUND OF THE INVENTION

Soft errors from radiation particles, which are also known as single event upsets (SEUs), are a large concern in high reliability applications. In chips with even moderate amount of unprotected SRAM arrays, SEUs can dominate the error rate. SEUs in latches are a growing concern in terrestrial applications for the 90 nm semiconductor technology and beyond. SEUs are a greater concern in high radiation applications, such as aerospace or military applications.

Many known circuit techniques reduce the SEU sensitivity of a circuit with an accompanying area or performance penalty. Fault tolerant systems can detect most or all SEUs and correct some of them, at the expense of greater complexity and often with performance penalties. At a given lithographic node, SOI circuits have lower SEU rates than comparable bulk circuits; the SEU rate of SOI SRAMs is often less than 20 percent of that of comparable bulk SRAMs. SOI semiconductor devices have lower SEU rate because the volume of the semiconductor material that can collect charges generated by ionizing radiation is confined above the BOX. Bulk semiconductor devices have a much higher SEU rate because the volume of the semiconductor material sensitive to ionizing radiation extends at least as deep as the thickness of doped wells. In this regard, SOI substrates offer greater radiation immunity than bulk substrates.

According to hybrid orientation technology (HOT), a portion of a semiconductor substrate has an SOI structure with one surface orientation and another portion of the same semiconductor structure has a bulk substrate structure with another surface orientation. Such a semiconductor substrate is herein referred to as a "HOT substrate." HOT substrates have been used to build MOSFETs of different types on different orientations of semiconductor surfaces with resulting substantial gains in device performance. According to HOT, the NFETs and PFETs are fabricated in regions with different crystal orientation to optimize the mobility of minority carriers in the channel for both devices, i.e. NFETs are in a region of (100) crystal orientation to maximize the mobility of electrons, while PFETs are in a region of (110) crystal orientation to maximize the mobility of holes. A region of one crystal orientation, which is used for devices of one polarity (either NFETs or PFETs), is located in the SOI portion of the semiconductor substrate and another region of the other crystal orientation, which is used for devices of the other polarity (either PFETs or NFETs), is located in the bulk portion of the semiconductor substrate.

Due to the inherently higher SEU rate of devices built on a bulk substrate, the MOSFET devices built in the bulk portion of the semiconductor substrate are as prone to high SEU rates as equivalent devices built on a bulk substrate.

Therefore, there exists a need for structures and methods for reducing SEU rates on CMOS devices built in the bulk portion of a HOT substrate.

Also, if PFETs are built in the bulk portion of a HOT wafer with a P-handler substrate, the parasitic bipolar transistor components and the parasitic resistors of the structure containing of N+ contact to the N− well, PFETs built on the N− well, N− well itself, and the P− substrate forms a latchup circuitry as in such devices built on a bulk P− substrate. Protection against latchup for the MOSFET devices built in the bulk portion of the semiconductor substrate is desired.

Therefore, there exists a need for providing protection against latchup for PFETs built in the bulk portion of a HOT substrate.

SUMMARY OF THE INVENTION

The present invention provides structures and methods for reducing SEU on CMOS devices built in the bulk portion of a HOT substrate by forming at least one high density recombination center.

The present invention also provides structures and methods for providing protection against latchup for PFETs built in the bulk portion of a HOT substrate by forming a latchup prevention layer.

According to the present invention, the SEU rate of circuits on the bulk portion of a HOT substrate is reduced by forming at least one buried layer with a high density of recombination centers under the CMOS devices that are formed in the epitaxial semiconductor layer. The buried recombination centers attract both electrons and holes and combines them. The epitaxial layer is located within the bulk portion of the HOT substrate at the same level as the buried oxide (BOX) layer and the top semiconductor layer in the SOI portion of the HOT substrate. The buried recombination layer prevents collection of charges generated below that layer at the CMOS devices above the buried recombination layer. For the CMOS devices built over the buried recombination layer, the volume of the semiconductor material that is sensitive to ionizing radiation in a way that affects the SEU rate of the CMOS devices is confined above the buried recombination layer, on par with the corresponding volume for the CMOS devices built on SOI portion of the HOT substrate. While the volume of the semiconductor material below the buried recombination layer is still sensitive to the ionizing radiation, any charge generated in that volume is absorbed in the buried recombination layer and does not affect the SEU rate of the CMOS devices above.

According to the present invention, one buried recombination layer may be located inside the bulk portion of the HOT substrate either above the level of the bottom of the BOX layer or below the level of the BOX layer. Preferably, the buried recombination layer does not extend above the level of the top of the BOX layer. Alternatively, two buried recombination layers may be located inside the bulk portion of the HOT substrate, one above the level of the bottom of the BOX layer and the other below the level of the BOX layer. Preferably, none of the buried recombination layer extends above the level of the top of the BOX layer According to the present invention, a combination of a latchup prevention layer and a buried recombination layer may be provided. The latchup prevention layer is located above the level of the bottom of the BOX layer. The buried recombination layer is located below the level of the BOX layer. Preferably, the latchup prevention layer does not extend above the level of the top of the BOX layer.

According to the present invention, methods of forming the structures described above are also provided. The process of forming the structures of the present invention is embedded into the process of conventional methods of forming a HOT substrate with a few extra steps in the conventional HOT process flow. First, a bonded SOI substrate is provided wherein the handler substrate below the BOX layer and the top semiconductor layer above the BOX have two different crystallographic orientations. A pad layer and a masking layer are formed over the entire top surface of the bonded SOI substrate. A photoresist is then applied and patterned by a well known lithographic technique to form an etch window over the area in which a bulk portion of a HOT substrate is to be formed. The top semiconductor layer and the BOX layer are removed from within the etch window during an etch process. The remaining photoresist is then removed. A boundary spacer is formed along the inner exposed sidewalls of the patterned BOX layer and the top semiconductor layer by a blanket conformal deposition of the boundary spacer layer followed by a reactive ion etch (RIE). Up to this point, the process flow is identical to conventional HOT substrate process.

According to the first embodiment of the present invention, a first selective epitaxy of a semiconductor material up to a height between the bottom and the top of the top semiconductor layer is performed. Thereafter, an implantation of recombination center generating elements is performed to form a buried recombination layer within the epitaxially grown semiconductor material. N-type dopant such as P or As may also implanted at the same time to form a retrograded n-well for PFET device. Preferably, the height of the recombination layer is between the bottom and the top of the BOX layer. The implant species may comprise nitrogen, oxygen, carbon, germanium, argon, krypton, xenon, gold, and platinum. Some of the elements such as germanium, argon, krypton, xenon destroy the crystal structure of the semiconductor material within the implanted region. The implant damage is healed by a high temperature anneal in the portion of the handler substrate located above the buried recombination layer. However, due to the presence of the implanted species within the buried recombination layer, the recombination layer contains crystalline defects that serve as a recombination center for charged particles even after the anneal process. The formation of the buried recombination layer is the inventive step of the present invention. The anneal is followed by a second selective epitaxy of the semiconductor material up to the top of the masking layer. Planarization of the epitaxially grown semiconductor material and the formation of CMOS devices follow as in the prior art.

According to the second embodiment of the present invention, instead of a first selective epitaxial deposition of semiconductor material within the etched window, formation of a buried recombination center by implantation of electrically inactive species is performed immediately after the formation of the etched window in the BOX layer and the boundary spacers and the top semiconductor layer. The implantation delivers an recombination center generating implant species into the handler substrate within the etched window to form a buried recombination layer below and not adjoining the exposed surface of the handler substrate. An anneal is performed to remove the implantation damage from above the buried recombination layer. Thereafter, a selective epitaxial deposition of the semiconductor material within the etched window up to the top of the masking layer or above is performed followed by a planarization of the epitaxially grown semiconductor material and the formation of CMOS devices as in the prior art.

According to the third embodiment of the present invention, after the formation of the spacers on the inner sidewalls of the etched window, two rounds of a process combination are performed, each of which rounds contains an implantation of recombination center generating elements followed by a high temperature anneal. The two rounds of the process combination are separated by a first selective epitaxy of a semiconductor material up to a height between the bottom and the top of the top semiconductor layer. The resulting structure has two buried recombination layers, one below the BOX layer and the other one between the top surface and the bottom surface of the BOX layer. Next, a second selective epitaxy up to the top of the masking layer is followed by a planarization of the epitaxially grown semiconductor material and the formation of CMOS devices as in the prior art.

According to the fourth embodiment of the present invention, the third embodiment is modified to convert the top buried recombination layer into a latchup prevention layer if the handler substrate is a P– substrate and the semiconductor device formed within the etched window, or the bulk portion of the HOT substrate, is a PFET. To fabricate this structure, shallow trench isolation (STI) is formed in a bulk portion of the HOT substrate, preferably on the edge of the HOT substrate for area efficiency. Contact holes are formed through the STI to contact the top buried recombination layer. Contacts are then formed to the top buried recombination layer by filling the contact holes with a conductive material. With the contacts biased with a positive voltage supply, the top buried recombination center is converted into a latchup prevention layer that collects electrons and prevents a latchup.

DETAILED DESCRIPTION OF THE INVENTION

A detailed description of the present invention is herein provided with accompanying figures.

Figure 1:
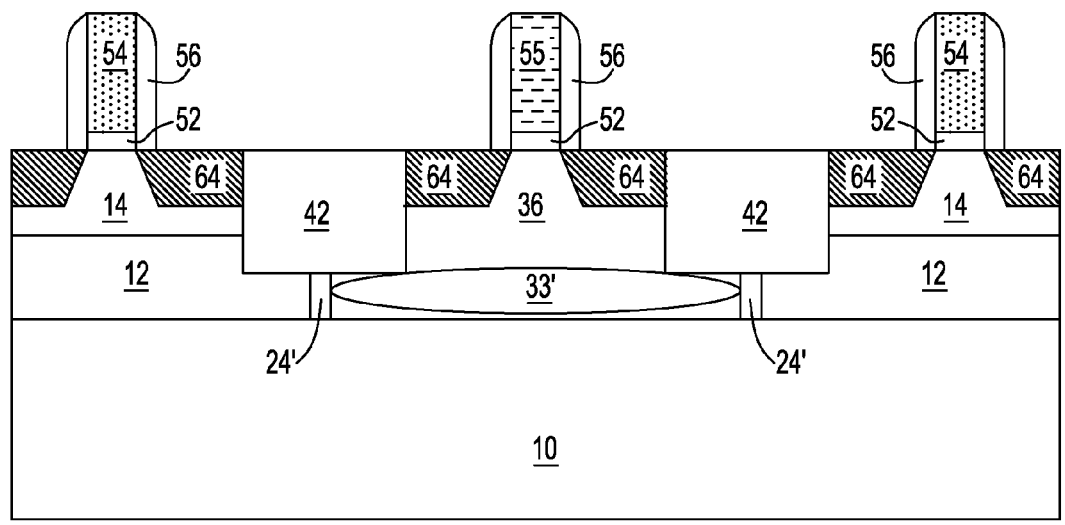
FIG. 1 shows a semiconductor structure containing a buried recombination layer 33 according to the first embodiment of the present invention.

FIG. 1 shows a semiconductor structure according to the first embodiment of the present invention. A hybrid orientation technology (HOT) substrate comprises a handler substrate 10, a buried insulator layer 12, a top semiconductor layer 14, and an epitaxially grown semiconductor layer 36. The buried insulator layer 12 and the top semiconductor layer constitute the SOI portion of the HOT substrate along with the portion of the handler wafer therebelow and the CMOS devices thereabove. The epitaxially grown semiconductor layer 36 constitutes the bulk portion of the HOT substrate along with the portion of the handler wafer therebelow and the CMOS devices thereabove.

The handler substrate 10 has a different crystallographic orientation than the top semiconductor layer 14. In a first example, the handler substrate 10 has a (110) orientation and the top semiconductor layer 14 has a (100) orientation. Preferably, NFETs are constructed in the SOI portion and the PFETs are constructed in the bulk portion of the HOT substrate. In a second example, the handler substrate 10 has a (100) orientation and the top semiconductor layer 14 has a (110) orientation. Preferably, PFETs are constructed in the SOI portion and the NFETs are constructed in the bulk portion of the HOT substrate. Alternatively, other major crystallographic orientations such as (111) and/or (211) may be selected for the handler substrate or for the top semiconductor layer. The present invention is herein described with a preferred case of the first example, with a (110) handler substrate 10, a (100) top semiconductor layer 14, NFETs constructed in the SOI portion, and PFETs constructed in the bulk portion, However, one of ordinary skill in the art can readily practice variations of the described version of the present invention with different crystallographic orientations and/or device types.

The material for the handler wafer 10 and the top semiconductor layer 14 are semiconductor material selected from intrinsic silicon, intrinsic silicon germanium alloy, intrinsic silicon carbon alloy, intrinsic silicon germanium carbon alloy, P-doped silicon, P-doped silicon germanium alloy, P-doped silicon carbon alloy, P-doped silicon germanium carbon alloy, N-doped silicon, N-doped silicon germanium alloy, N-doped silicon carbon alloy, and N-doped silicon germanium carbon alloy. The material for the handler wafer 10 and the material for the top semiconductor layer 14 may be the same or different.

Shallow trench isolation (STI) 42 and remnant boundary spacers 24' are located between the bulk portion and the SOI portion of the HOT substrate. The remnant boundary spacers 24' are the remaining portions of the boundary spacers 24 (shown in FIG. 2) after the formation of STI 42. A recombination layer 33, which is a feature of the present invention, is formed within the bulk portion below the level of the top semiconductor layer 14, that is, below the level of the boundary between the buried insulator layer 12 and the top semiconductor layer 14. The recombination layer contains an alloy of a semiconductor material and at least one recombination center generating element. Two NFETs, each of which comprises NFET source/drain regions 64, a gate dielectric 52, a gate electrode 54, spacers 56, and a body containing a portion of the top semiconductor layer 14, are shown in the SOI portion. One PFET comprising PFET source/drain regions 65, a gate dielectric 52, a PFET gate electrode 54, spacers 56, and a body comprising a portion of the epitaxially grown semiconductor layer 36 is shown in the bulk portion.

According to the first embodiment of the present invention, the recombination layer 33 contains at least one recombination center generating element. A recombination center generating element does not change the conductivity type of the semiconductor material in which it is implanted. Recombination center generating elements include nitrogen, oxygen, carbon, germanium, argon, krypton, xenon, gold, and platinum.

The thickness of the recombination layer is in the range between 5 nm and 200 nm, and preferably between 10 nm and 50 nm. Preferably, the thickness of the recombination layer 33 is less than that of the buried insulator layer 12. The concentration of the implanted inert element is within the range between $1.0 \times 10^{12}/cm^3$ and $1.0 \times 10^{21}/cm^3$. The dose of the implanted inert elements is determined to achieve the concentration range within the thickness of the recombination layer.

The methods used to form the structures of the first embodiment of the present invention are now described.

Figure 2:
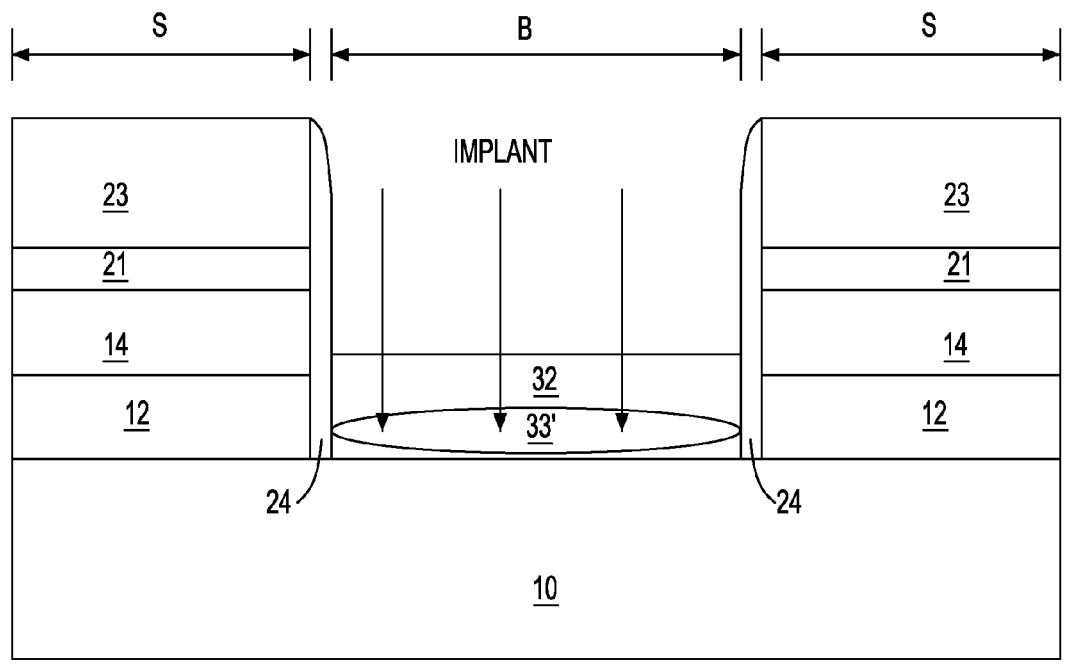
FIG. 2 shows a semiconductor structure during the implantation of recombination center generating elements according to the first embodiment of the present invention.

According to the present invention, a hybrid orientation technology (HOT) substrate comprises a handler substrate 10, a buried insulator layer 12, a top semiconductor layer 14 is provided. A pad layer 21 and a masking layer 23 is deposited on the top surface of the HOT substrate as shown in FIG. 2, followed by a lithographic patterning of at least one etch window that is the complement of the SOT portion, S of the HOT substrate. For example, the pad layer 21 may be a silicon dioxide layer and the masking layer 23 may be a dielectric layer such as an silicon dioxide layer or a silicon nitride layer.

Using the remaining developed photoresist outside the etch window, the portion of the masking layer 23, the pad layer 21, the top semiconductor layer 14, and the buried insulator layer 12 inside the etch window is removed by a reactive ion etch (RIE). A boundary spacer layer is formed preferably by chemical vapor deposition on the HOT substrate. Another RIE is used to form boundary spacers 24 on the inner sidewalls of the etch window to etch the horizontal portions of the boundary spacer layer and to leave only the vertical portions of the boundary spacer layers. The area within the boundary spacers 24 is the bulk portion, "B" of the HOT substrate. The area outside the boundary spacers 24 is the SOI region, "S" of the HOT substrate.

According to the first embodiment of the present invention, a selective epitaxy of a first semiconductor material is performed on the HOT substrate. A lower epitaxially grown semiconductor layer 32 is selectively grown epitaxially over the exposed semiconductor surface of the handler substrate 10 with epitaxial alignment with the underlying crystalline structure of the handler substrate 10. Preferably but not necessarily, the lower epitaxially grown semiconductor layer 32 has the same semiconductor material as the handler substrate 10. The selective epitaxy of the lower epitaxially grown semiconductor layer 32 proceeds such that the top surface of the lower epitaxially grown semiconductor layer 32 reaches a level above the buried insulator layer 14 and between the top and the bottom of the top semiconductor layer 14. At this point, an implantation of at least one recombination center generating element is performed to form a recombination layer 33. Recombination center generating elements include nitrogen, oxygen, carbon, germanium, argon, krypton, xenon, gold, and platinum. N-type dopant such as P or As may also implanted at the same time to form a retrograded n-well for PFET device. The species for the implantation is chosen from the list above or a combination thereof. The dose and energy of the implantation is chosen to satisfy the specification for the dimensions and concentration listed above. FIG. 2 shows a structure according to the first embodiment of the present invention at this stage of processing.

The recombination center generating elements introduce damage to the crystalline structure such as point defects and dislocations into the recombination layer 33 and the volume of the semiconductor material immediately above the recombination layer 33 in the path of the implanted elements. By performing a high temperature anneal, the crystalline defects, or the damage to the crystalline structure, is healed above the recombination layer. Due to the presence of the implanted recombination center genera elements, the recombination layer 33 still maintains a high density of crystalline defects. The high defect density serves as a recombination center wherein holes and electrons that are produced by an ionizing radiation are collected by and annihilated by recombination. The high temperature anneal process may be selected from a conventional anneal in a furnace, a rapid thermal anneal, a flash anneal, and a laser anneal. The mechanism of the healing of the structural damage is solid phase epitaxy. The regrowth rate in solid phase epitaxy is thermally dominated and the selection of a particular anneal method typically places limits on the temperature range for the anneal method. Typical temperature ranges for the anneal processes are from about 650° C. to about to 1428° C. and the anneal time is exponentially dependent on the inverse of the absolute temperature of the anneal process. During the solid phase epitaxy, the undamaged semiconductor structure outside the implanted area and adjacent to the structurally damaged portion of the semiconductor above the recombination layer serves as a template for epitaxial realignment of the semiconductor material above the recombination layer.

Thereafter, an upper epitaxially grown semiconductor layer (not shown) is selectively grown epitaxially over the lower epitaxially grown semiconductor layer 32 with epitaxial alignment with the underlying lower epitaxially grown semiconductor layer 32. Preferably but not necessarily, the semiconductor material within the upper epitaxially grown semiconductor layer is the same material as the semiconductor material within lower epitaxially grown semiconductor layer 32. The selective epitaxy of the upper epitaxially grown semiconductor layer proceeds such that the top surface of the upper epitaxially grown semiconductor layer reaches a level above the top semiconductor layer 14. Preferably, the upper epitaxially grown semiconductor layer is grown slightly above the level of the top surface of the masking layer 23. Thereafter, the process flow follows standard process flow for a HOT substrate including a planarization of the upper epitaxially grown semiconductor layer, removal of the masking layer 23 and the pad layer 21 and a portion of the boundary spacers 24, and an optional recess of the upper epitaxially grown semiconductor layer. The remaining upper epitaxially grown semiconductor layer and the lower epitaxially grown semiconductor layer 32 collectively form epitaxially grown semiconductor layer 36 shown in FIG. 1.

Referring back to FIG. 1, shallow trench isolation (STI) 42 is formed, which further reduces the boundary spacers 24 into remnant boundary spacers 24'. N-well and p-well ion implantations are performed into the epitaxially grown semiconductor layer 36 and the top semiconductor layer 14. Gate dielectric 56 is formed and then gate electrodes 54, 55 are formed by deposition and patterning of a gate stack. This is followed by halo and extension implants, formation of the spacers 56, and the formation of the source/drain regions 64, 65.

According the second embodiment of the present invention, the process step for a selective epitaxy of a first semiconductor material is omitted. With the lack of a semiconductor material at the level of the buried insulator 12, the next step of implantation delivers recombination center generating elements into the handler substrate 10 within the bulk portion of the HOT substrate. This results in the formation of a recombination layer within the handler substrate 10. The process parameters for the implantation according to the second embodiment such as the implant dose, dimensions of the recombination layer, etc. are identical to those in the first embodiment of the present invention. The same high temperature anneal is performed to heal the crystalline above the recombination layer within the handler substrate 10. The thickness for a selective growth of an upper epitaxially grown semiconductor layer according to the first embodiment is increased to compensate for the lack of a lower epitaxially grown semiconductor layer such that the height of the resulting epitaxially grown semiconductor layer is the same between the first and the second embodiments after the selective growth of an upper epitaxially grown semiconductor layer. In the resulting structure, the difference in the structures between the first and the second embodiment is the location of the recombination layer. According to the second embodiment of the present invention, the resulting recombination layer is below the level of the interface between the hander wafer 10 and the buried insulator layer 12.

According to the third embodiment of the present invention, two recombination layers, comprising one top recombination layer and one bottom recombination layer, are formed, wherein the top recombination layer is identical to the recombination layer according to the first embodiment and the bottom recombination layer is identical to the recombination layer according to the second embodiment of the present invention. The bottom recombination layer containing a second alloy of a semiconductor material and at least one second recombination center generating element. Specifically, the bottom recombination layer is first formed according to the second embodiment of the present invention. After a (first) high temperature anneal according to the second embodiment, the process sequence according to the first embodiment is followed beginning with the selective epitaxy of the lower epitaxially grown semiconductor layer 32. Each of the two recombination layers in the resulting structure is used to collect charge carriers, i.e., electrons and holes, and recombine them to reduce SEU rates in the bulk portion of the HOT substrate. The bottom recombination layer may be contacted as needed to insure good grounding. The resulting structure is similar to FIG. 3 except that contacts 72 to the top recombination layer 33' are not present according to the third embodiment of the present invention.

Figure 3:
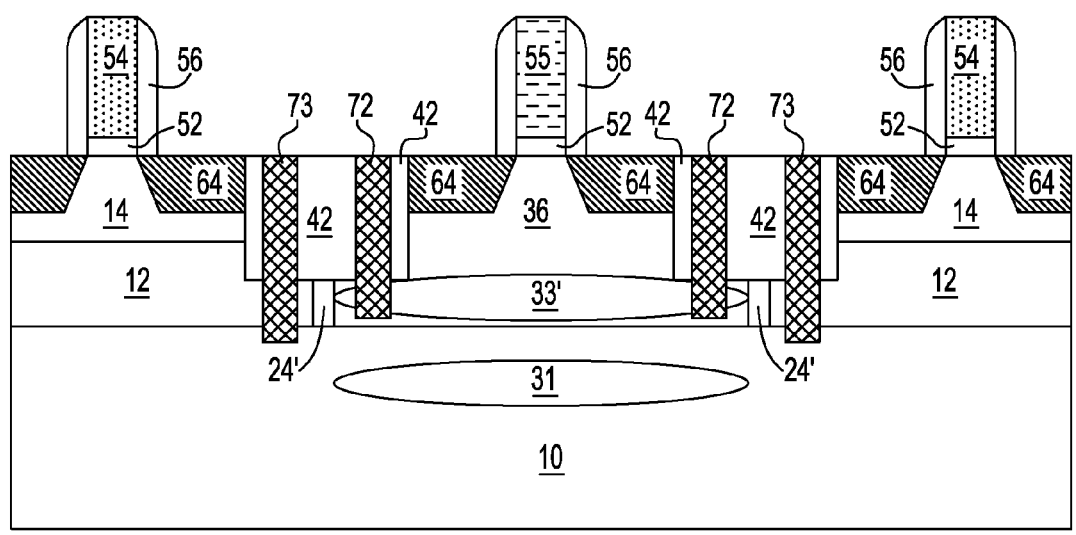
FIG. 3 shows a semiconductor structure containing a buried recombination layer 31 and a latchup prevention layer 33' according to the fourth embodiment of the present invention.

According to the fourth embodiment of the present invention, at least one first contact hole is formed through STI 42 and over and into a top recombination layer 33' and at least one second contact hole is formed through STI 42 outside the top recombination layer 33' as shown in FIG. 3. The at least one second contact hole may alternatively be formed through a region comprising the top semiconductor layer 14 and the buried oxide layer, in which the region is surrounded by STI 42. Preferably, the CMOS devices in the bulk portion of the HOT substrate are PFETs. In this case, the drain of a PFET within the bulk portion of the HOT substrate may also be used for the formation of contact holes. At least one first contact 72 is formed within the at least one first contact hole formed through STI 42 and over and into the top recombination layer 33' by filling the at least one first contact hole with a conductive material such as heavily doped N+ type polycrystalline silicon. At least one second contact 73 is formed within the at least one second contact hole formed through STI 42 outside the top recombination layer 33' by filling the at least one second contact hole with a conductive material such as heavily doped P+ type polycrystalline silicon.

In an example, the handler substrate is a p-type substrate. The top recombination layer 33' is positively biased through the at least one first contact 72 to collect electrons to prevent circuit latchup. Therefore, the top recombination center serves as a latchup prevention layer according to the fourth embodiment of the present invention. The bias applied to the at least one first contact depends on circuit applications and can vary between a positive power supply voltage Vdd and ground, as the top recombination layer 33' is in direct contact with the epitaxially grown semiconductor layer 36, within which NFETs are formed. The at least one first contact 72 insures that the top recombination layer 33' is physically contacted. The at least one first contact 72 also provide a well bias to the epitaxially grown semiconductor layer 36. The bottom recombination layer 31 is grounded through the at least one second contact 73. Therefore, the PN junction between the handler wafer and the epitaxially grown semiconductor layer 36 is reverse biased through the at least one first contact 72 and the at least one second contact 73. The bottom recombination layer 31 serves as a recombination center as in the prior embodiments and collects electrons and holes.

While the invention has been described in terms of specific embodiments, it is evident in view of the foregoing description that numerous alternatives, modifications and variations will be apparent to those skilled in the art Accordingly, the invention is intended to encompass all such alternatives, modifications and variations which fall within the scope and spirit of the invention and the following claims.

What is claimed is:

1. A semiconductor structure comprising:
a hybrid orientation technology (HOT) substrate including a handler substrate having a p-type doping, a buried insulator layer, a top semiconductor layer, and an epitaxially grown semiconductor layer, wherein said HOT substrate has an SOI portion and a bulk portion, wherein said SOI portion contains said top semiconductor layer and said buried insulator layer and said bulk portion contains said epitaxially grown semiconductor layer, and wherein said handler substrate abuts a bottom surface of said buried insulator layer and a bottom surface of said epitaxially gown semiconductor layer;
at least one first CMOS device located in said SOI portion;
at least one second CMOS device located in said bulk portion;
a top recombination layer containing a first alloy of a semiconductor material and at least one first recombination center generating element and located within said epitaxially grown semiconductor layer in said bulk portion and below the level of said top semiconductor layer;
a bottom recombination layer containing a second alloy of a semiconductor material and at least one second recombination center generating element and located below said epitaxially grown semiconductor layer within said handler substrate in said bulk portion and below the level of said top semiconductor layer, wherein said bottom recombination layer underlies said top semiconductor layer and does not abut said top recombination layer, and wherein said at least one first recombination center generating element and said at least one second recombination center generating element are selected from the group consisting of nitrogen, oxygen, carbon, germanium, neon, argon, krypton, xenon, gold, and platinum;
a PN junction between said handler substrate and said epitaxially grown semiconductor layer, wherein said PN junction is substantially horizontal and located between said top recombination layer and said bottom recombination layer;
at least one first contact comprising a conductive material and abutting said top recombination layer, wherein an upper portion of said at least one first contact is located within, and laterally abutting, a shallow trench isolation structure; and
at least one second contact comprising a conductive material and abutting said handler substrate and electrically connected to said bottom recombination layer, wherein said at least second contact laterally abuts said shallow trench isolation structure and said buried insulator layer, wherein said bottom recombination layer is grounded through said at least one second contact, and wherein said top recombination layer is positively biased to collect electrons, wherein said bottom recombination layer functions as a recombination center, and wherein said PN junction is reverse biased through said at least one first contact and said at least one second contact.

* * * * *